(12) United States Patent
Yoon et al.

(10) Patent No.: US 9,406,900 B2
(45) Date of Patent: Aug. 2, 2016

(54) ORGANIC LIGHT-EMITTING DISPLAY APPARATUS INCLUDING A SECOND ELECTRODE

(71) Applicant: SAMSUNG DISPLAY CO., LTD., Yongin, Gyeonggi-Do (KR)

(72) Inventors: Seok-Gyu Yoon, Yongin (KR); Dong-Chan Kim, Yongin (KR); Won-Jong Kim, Yongin (KR); Eung-Do Kim, Yongin (KR); Dong-Kyu Seo, Yongin (KR); Young-Woo Song, Yongin (KR); Jong-Hyuk Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/585,439

(22) Filed: Dec. 30, 2014

(65) Prior Publication Data

US 2015/0236296 A1 Aug. 20, 2015

(30) Foreign Application Priority Data

Feb. 19, 2014 (KR) .................. 10-2014-0019221

(51) Int. Cl.
*H01L 51/52* (2006.01)

(52) U.S. Cl.
CPC ............................ *H01L 51/5234* (2013.01)

(58) Field of Classification Search
CPC ............ H01L 27/3258; H01L 27/3248; H01L 2251/5315; H01L 51/5203; H01L 51/5212
See application file for complete search history.

(56) References Cited

U.S. PATENT DOCUMENTS

| 5,677,572 A | 10/1997 | Hung et al. | |
|---|---|---|---|
| 2007/0031700 A1* | 2/2007 | Guo | H01L 51/5092 428/690 |
| 2008/0157663 A1* | 7/2008 | Sung | H01L 51/5203 313/504 |
| 2009/0212688 A1* | 8/2009 | Song | H01L 51/508 313/504 |
| 2011/0240964 A1* | 10/2011 | Ko | H01L 27/3248 257/40 |
| 2011/0241000 A1* | 10/2011 | Choi | H01L 51/5218 257/59 |
| 2012/0097956 A1 | 4/2012 | Yun et al. | |
| 2012/0112628 A1 | 5/2012 | Yoon et al. | |
| 2012/0132916 A1* | 5/2012 | Jung | H01L 27/326 257/59 |
| 2013/0168712 A1* | 7/2013 | Jeong | H01L 51/5275 257/98 |
| 2014/0291625 A1* | 10/2014 | Seo | H01L 51/055 257/40 |
| 2014/0346458 A1* | 11/2014 | Park | H01L 27/1259 257/40 |
| 2014/0353631 A1* | 12/2014 | Park | H01L 51/5228 257/40 |
| 2015/0021565 A1* | 1/2015 | Min | H01L 51/5256 257/40 |
| 2015/0031152 A1* | 1/2015 | Choi | H01L 51/56 438/28 |
| 2015/0060797 A1* | 3/2015 | Lee | H01L 51/0003 257/40 |
| 2015/0200381 A1* | 7/2015 | Liu | H01L 51/5012 257/40 |

FOREIGN PATENT DOCUMENTS

| KR | 10-2008-0061732 A | 7/2008 |
|---|---|---|
| KR | 10-2012-0042473 A | 5/2012 |
| KR | 10-2012-0049639 A | 5/2012 |

* cited by examiner

*Primary Examiner* — Mohsen Ahmadi
(74) *Attorney, Agent, or Firm* — Lee & Morse, P.C.

(57) ABSTRACT

Provided is an organic light-emitting display apparatus that includes a substrate; a first electrode on the substrate; an intermediate layer on the first electrode and including an organic emission layer; and a second electrode that includes a first layer including a dipole material, a second layer including a material having a work function of 3.6 eV or less, and a third layer including a conductive material, wherein the first to third layers are sequentially disposed on the intermediate layer.

14 Claims, 1 Drawing Sheet

ORGANIC LIGHT-EMITTING DISPLAY APPARATUS INCLUDING A SECOND ELECTRODE

CROSS-REFERENCE TO RELATED APPLICATION

Korean Patent Application No. 10-2014-0019221, filed on Feb. 19, 2014, in the Korean Intellectual Property Office, and entitled: "Organic Light-Emitting Display Apparatus," is incorporated by reference herein in its entirety.

BACKGROUND

1. Field

One or more embodiments relate to an organic light-emitting display apparatus.

2. Description of the Related Art

An organic light-emitting display apparatus may include organic light-emitting diodes (OLEDs) that may include hole injection electrodes, electron injection electrodes, and organic emission layers formed between the hole injection electrodes and the electron injection electrodes. The organic light-emitting display apparatus may be a self-emissive display apparatus, in which holes injected from the hole injection electrodes and electrons injected from the electron injection electrodes may combine in the organic emission layer and generate excitons. Light may be generated as the excitons drop from an excited state to a ground state.

An organic light-emitting display apparatus may be self-emissive, a separate light source may be unnecessary, and the organic light-emitting display apparatus may be driven at a low voltage and be configured to be lightweight and thin. Excellent viewing angle, contrast, response time, and other characteristics, may result in an organic light-emitting display apparatus being widely used in personal portable devices, such as, for example, MP3 players, mobile phones, and televisions.

SUMMARY

Embodiments may be realized by providing an organic light-emitting display apparatus, including a substrate; a first electrode on the substrate; an intermediate layer on the first electrode and including an organic emission layer; and a second electrode that includes a first layer including a dipole material, a second layer including a material having a work function of 3.6 eV or less, and a third layer including a conductive material, the first to third layers being sequentially disposed on the intermediate layer.

The first to third layers may be formed of lithium fluoride (LiF), ytterbium (Yb), and silver (Ag), respectively.

The second electrode may further include a fourth layer between the second and third layers and may include a compound of Yb and Ag.

Sheet resistance values of the second to fourth layers may be 5 $\Omega/cm^2$ or less.

A thickness of the first layer may be between about 0.5 nm to about 5 nm.

A thickness of the second layer may be between about 0.5 nm to about 5 nm.

A thickness of the third layer may be between about 0.5 nm to about 5 nm.

The first layer may include a fluoride-based compound or a chloride-based compound.

The second layer may include metal, a metal alloy, or a metal-oxide.

The third layer may include at least one of silver (Ag), aluminum (Al), indium tin oxide (ITO), indium zinc oxide (IZO), zinc oxide (ZnO), indium oxide ($In_2O_3$), indium gallium oxide (IGO), aluminum zinc oxide (AZO), nanowires, and graphene.

The first electrode may include a reflecting metal layer and a transparent conductive oxide layer.

The first electrode may include a stacked layer structure formed by sequentially stacking indium tin oxide (ITO), silver (Ag), and ITO, and a thickness of a Ag layer in the first electrode may be 600 Å or greater.

A thickness of the second layer may be between about 0.5 nm to about 5 nm.

A thickness of the third layer may be between about 0.5 nm to about 5 nm.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
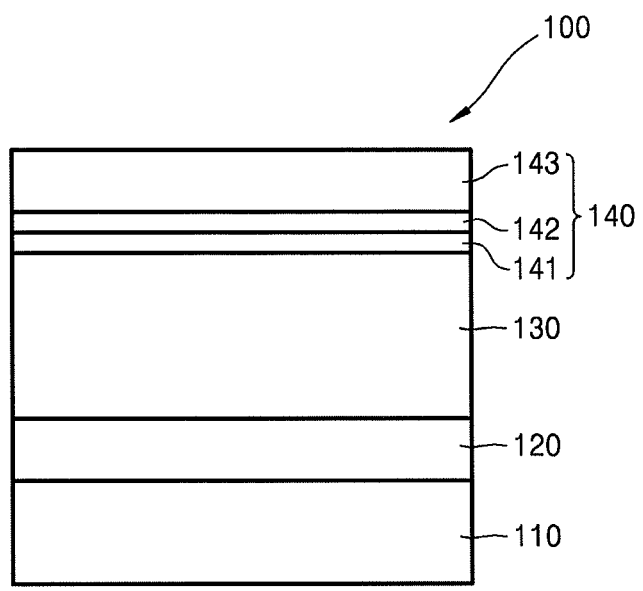
FIG. 1 illustrates a schematic sectional view of an organic light-emitting display apparatus, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the accompanying drawings, like reference numerals refer to like elements throughout. The embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. It will also be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of elements in the drawings may be exaggerated for convenience of explanation. In other words, since sizes and thicknesses of components in the drawings are arbitrarily illustrated for convenience of explanation, the following embodiments are not limited thereto.

FIG. 1 illustrates a schematic sectional view of an organic light-emitting display apparatus 100, according to an embodiment.

Referring to FIG. 1, the organic light-emitting display apparatus 100 according to an embodiment may include a substrate 110, a first electrode 120 on the substrate 110, an intermediate layer 130 that includes an organic emission layer (EML) and may be on the first electrode 120, and a second electrode 140 that may include a first layer 141, a second layer 142, and a third layer 143.

The substrate 110 may be a glass substrate or a plastic substrate having excellent mechanical strength, thermal stability, transparency, surface smoothness, may be easily handled, and may be waterproof. The first electrode 120 may be on the substrate 110.

The first electrode 120 may be an anode that may serve as a hole injection electrode, and may be a reflection electrode. The first electrode 120 may include a reflecting metal layer that may include at least one of silver (Ag), magnesium (Mg), aluminum (Al), platinum (Pt), palladium (Pd), gold (Au), nickel (Ni), neodymium (Nd), iridium (Ir), and chrome (Cr), and a transparent conductive oxide layer formed on and/or under the reflecting metal layer.

The transparent conductive oxide layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The first electrode 120 may be formed as, for example, a stacked layer structure of ITO/Ag/ITO. A thickness of Ag may be 600 Å or above, for example, to have a sufficient reflectance in the visible region.

The intermediate layer 130 may be disposed on the first electrode 120. The intermediate layer 130 includes the organic EML and may further include a hole transport region, between the first electrode 120 and the organic EML, and an electron transport region, between the organic EML and the second electrode 140.

The hole transport region may include, for example, at least one of a hole injection layer (HIL), a hole transport layer (HTL), a buffer layer, and an electron blocking layer (EBL). The electron transport region may include, for example, at least one of a hole blocking layer (HBL), an electron transport layer (ETL), and an electron injection layer (EIL).

The organic EML may include copper phthalocyanine (CuPc), N'-Di(naphthalene-1-yl)-N,N'-diphenyl-benzidine (NPB), tris(8-hydroxyquinolinato)aluminum ($Alq_3$), a poly (p-phenylene vinylene) (PPV)-based organic material, or a polyfluorene-based organic material.

The organic EML included in the intermediate layer 130 may include an organic material that emits, for example, red, green, or blue light. In an embodiment, the organic EML may emit white light. The organic EML may include a structure in which a light-emitting material emitting red light, a light-emitting material emitting green light, and a light-emitting material emitting blue light are stacked on one another, or a structure in which the light-emitting materials emitting red, green, and blue light are mixed.

The colors red, green, and blue are only provided as examples. Any combination of other various colors, which is capable of emitting white light, may be employed in addition to a combination of red, green, and blue.

The second electrode 140, which may include the first layer 141, the second layer 142, and the third layer 143 that are sequentially disposed on the intermediate layer 130, is disposed on the intermediate layer 130. The second electrode 140 may be a cathode that is an electron injection electrode.

The first layer 141 includes a dipole material, and may include a fluoride-based compound or a chloride-based compound.

The first layer 141 may be a non-conductive layer, that transmits electrons injected from the second and third layers 142 and 143 to the intermediate layer 130 by tunneling, and may be formed as a thin film, for example, to allow tunneling.

For example, a thickness of the first layer 141 may range from about 0.5 nm to about 5 nm. When the thickness of the first layer 141 is less than about 0.5 nm, deposition may be difficult. Alternatively, when the thickness of the first layer 141 is greater than about 5 nm, tunneling may be difficult, and it may be difficult to transmit the electrons injected from the second and third layers 142 and 143 to the intermediate layer 130 that includes the organic EML.

The second layer 142 may include metal, a metal alloy, or metal oxide having a work function of about 3.6 eV or less.

The second layer 142 between the first and third layers 141 and layer 143 has a lower work function than the third layer 143. If a work function of the third layer 143 is too high, it may be difficult to inject electrons into the intermediate layer 130. The second layer 142, which may be formed of a material having a low work function, may be disposed under the third layer 143, and electrons may be more easily injected to the intermediate layer 130.

A thickness of the second layer 142 may range from about 0.5 nm to about 5 nm. When the thickness of the second layer 142 is less than about 0.5 nm, deposition may be difficult. Alternatively, when the thickness of the second layer 142 is greater than about 5 nm, transmittance may be decreased, and efficiency of light that may be externally emitted via the second electrode 140 may be decreased.

The third layer 143 may include a conductive material that has a high stability with respect to atmospheric environment, for example, at least one of Ag, Al, ITO, IZO, ZnO, $In_2O_3$, IGO, AZO, nanowires, and graphene.

A thickness of the third layer 143 may range from about 5 nm to about 30 nm. When the thickness of the third layer 143 is less than about 5 nm, resistance may be increased. Alternatively, when the thickness of the third layer 143 is greater than about 30 nm, transmittance may be decreased, and efficiency of light that may be externally emitted via the second electrode 140 may be decreased.

As described above, the second electrode 140 may be configured to include the first to third layers 141 to 143, an electron injection property may be improved, and driving voltages may be reduced and external quantum efficiency may be increased.

Figure 2:
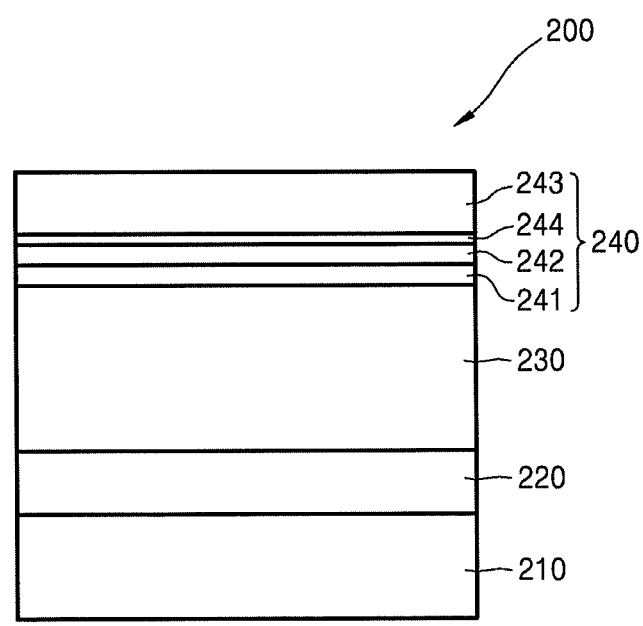
FIG. 2 illustrates a schematic sectional view of an organic light-emitting display apparatus, according to another embodiment.

FIG. 2 illustrates a schematic sectional view of an organic light-emitting display apparatus 200, according to another embodiment.

Referring to FIG. 2, the organic light-emitting display apparatus 200 according to another embodiment may include a substrate 210, a first electrode 220, an intermediate layer 230 that includes an organic EML and may be disposed on the first electrode 220, and a second electrode 240 that may include a first layer 241, a second layer 242, a third layer 243, and a fourth layer 244 that may be disposed between the second and third layers 242 and 243.

The substrate 210 may be a glass substrate or a plastic substrate. The first electrode 220 may be disposed on the substrate 210.

The first electrode 220 may be an anode that serves as a hole injection electrode, and may be a reflection electrode. The first electrode 220 may include a reflecting metal layer that may include at least one of Ag, Mg, Al, Pt, Pd, Au, Ni, Nd, Ir, and Cr, and a transparent conductive oxide layer formed on and/or under the reflecting metal layer.

The transparent conductive oxide layer may include at least one of ITO, IZO, ZnO, $In_2O_3$, IGO, and AZO.

The first electrode 220 may be formed as, for example, a stacked layer structure of ITO/Ag/ITO. A thickness of Ag may be 600 Å or above, for example, to have a sufficient reflectance.

The intermediate layer 230 may be disposed on the first electrode 220. The intermediate layer 230 includes the organic EML and may further include a hole transport region, between the first electrode 220 and the organic EML, and an electron transport region, between the organic EML and the second electrode 240.

The hole transport region may include, for example, at least one of an HIL, an HTL, a buffer layer, and an EBL. The electron transport region may include, for example, at least one of an HBL, an ETL, and an EIL.

The second electrode 240, which may include the first layer 241, the second layer 242, the third layer 243, and the fourth layer 244 disposed between the second and third layers 242 and 243 which are sequentially disposed on the intermediate layer 230, is disposed on the intermediate layer 230. The second electrode 240 may be a cathode that is an electron injection electrode.

The first to third layers 241 to 243 may be formed of lithium fluoride (LiF), ytterbium (Yb), and Ag, respectively. The fourth layer 244, which is a layer including a compound of Yb and Ag, may be additionally disposed between the second and third layers 242 and 243.

A thickness of the first layer 241 may range from about 0.5 nm to about 5 nm. When the thickness of the first layer 241 is less than about 0.5 nm, deposition may be difficult. Alternatively, when the thickness of the first layer 241 is greater than about 5 nm, tunneling may be difficult, and it may be difficult to transmit the electrons injected from the second and third layers 242 and 243 to the intermediate layer 230 that includes the organic EML.

A thickness of the second layer 242 may range from about 0.5 nm to about 5 nm. When the thickness of the second layer 242 is less than about 0.5 nm, deposition may be difficult. Alternatively, when the thickness of the second layer 242 is greater than about 5 nm, transmittance may be decreased, and efficiency of light that may be externally emitted via the second electrode 240 may be decreased.

A thickness of the third layer 243 may range from about 5 nm to about 30 nm. When the thickness of the third layer 243 is less than about 5 nm, resistance may be increased. Alternatively, when the thickness of the third layer 243 is greater than about 30 nm, transmittance may be decreased, and efficiency of light that may be externally emitted via the second electrode 240 may be decreased.

A thickness of the fourth layer 244 may be smaller than respective thicknesses of the first and second layers 241 and 242.

The third layer 243 may be formed of Ag, which has a high stability with respect to an external environment, and optically excellent properties, i.e., low resistance and high transmittance, when formed as a thin film.

Silver (Ag) is a material having a high work function of 4.5 eV or above. When only the third layer 243 or only the first and third layers 241 and 243 are stacked on the intermediate layer 230, electrons may not be injected from the third layer 243 to the intermediate layer 230, and light may not be emitted from the organic EML.

The organic light-emitting display apparatus 200 of FIG. 2 includes the second layer 242 that is disposed under the third layer 243. The second layer 242 may be formed of a material, e.g., Yb, having a low work function, i.e., lower than that of Ag, e.g., 2.6 eV.

Also, liquid Ag may have a property of being aggregated to reduce surface tension when being deposited. That is, Ag may be unevenly deposited on a surface, may aggregate, and a plurality of Ag particles may be formed.

In the organic light-emitting display apparatus 200 of FIG. 2, the second layer 242 may be disposed under the third layer 243 that may be formed of Ag, and electrons may be more easily injected to the intermediate layer 230. Also, the fourth layer 244, which is formed of a compound of Yb and Ag, may be disposed between the second and third layers 242 and 243. The third layer 243, which may be formed of Ag and on the fourth layer 244, may not be aggregated and may be uniform.

Sheet resistance values of the second to fourth layers 242 to 244 may be reduced, and the respective sheet resistance values may be about 5 $\Omega/cm^2$.

The first layer 241, which may be formed of LiF, may be disposed under the second layer 242. Li has a strong dipole property, allowing electrons to be relatively more easily injected from the second and third layers 242 and 243 to the intermediate layer 230.

TABLE 1

| Second Electrode | LiF/Ag | Liquid MgAg | LiF/Yb/Ag:Yb/Ag |
|---|---|---|---|
| Current Efficiency | Does not emit | 31.8 cd/A | 37.1 cd/A |
| Sheet Resistance | Mega ohm/sq | 50 ohm/sq | 3 ohm/sq |

Table 1 shows a comparison between respective current efficiencies and sheet resistances of the second electrode 240 of the present embodiment and comparative second electrodes.

Referring to Table 1, a comparative second electrode configured of LiF/Ag, electrons may not be injected, the second electrode may not emit light, and a sheet resistance value may be about Mega ohm/sq, for example, due to Ag aggregation. In comparison to a comparative second electrode configured of liquid MgAg, the second electrode 240 includes the first layer 241 of LiF, the second layer 242 of Yb, the fourth layer 244 of Ag:Yb, and the third layer 243 of Ag, the current efficiency may increase from about 31.8 cd/A to about 37.1 cd/A, and the sheet resistance may decrease about 50 ohm/sq to about 3 ohm/sq.

The values of current efficiency and sheet resistance indicate experimental values obtained when LiF, Yb, and Ag are 1 nm, 1 nm, and 16 nm, respectively.

The organic light-emitting display apparatus 100 and 200 according to the embodiments, respectively, may include the second electrodes 140 and 240 that have a low sheet resistance, an electron injection property may be improved, and driving voltages may be reduced and external quantum efficiency may be increased.

As described above, according to the one or more of the above embodiments, provided is an organic light-emitting display apparatus that may include a second electrode having a low sheet resistance and being highly efficient.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate;
   a first electrode on the substrate;
   an intermediate layer on the first electrode and including an organic emission layer; and
   a second electrode that includes a first layer including a dipole material, a second layer including a material having a work function of 3.6 eV or less, and a third layer including a conductive material, the first to third layers being sequentially disposed on the intermediate layer.

2. The organic light-emitting display apparatus as claimed in claim 1, wherein the first to third layers are formed of lithium fluoride (LiF), ytterbium (Yb), and silver (Ag), respectively.

3. The organic light-emitting display apparatus as claimed in claim 2, wherein the second electrode further includes a fourth layer between the second and third layers and includes a compound of Yb and Ag.

4. The organic light-emitting display apparatus as claimed in claim 3, wherein sheet resistance values of the second to fourth layers are 5 $\Omega/cm^2$ or less.

5. The organic light-emitting display apparatus as claimed in claim 1, wherein a thickness of the first layer is between about 0.5 nm to about 5 nm.

6. The organic light-emitting display apparatus as claimed in claim 5, wherein a thickness of the second layer is between about 0.5 nm to about 5 nm.

7. The organic light-emitting display apparatus as claimed in claim 6, wherein a thickness of the third layer is between about 0.5 nm to about 5 nm.

8. The organic light-emitting display apparatus as claimed in claim 1, wherein the first layer includes a fluoride-based compound or a chloride-based compound.

9. The organic light-emitting display apparatus as claimed in claim 1, wherein the second layer includes metal, a metal alloy, or a metal-oxide.

10. The organic light-emitting display apparatus as claimed in claim 1, wherein the third layer includes at least one of silver (Ag), aluminum (Al), indium tin oxide (ITO), indium zinc oxide (IZO), zinc oxide (ZnO), indium oxide ($In_2O_3$), indium gallium oxide (IGO), aluminum zinc oxide (AZO), nanowires, and graphene.

11. The organic light-emitting display apparatus as claimed in claim 1, wherein the first electrode includes a reflecting metal layer and a transparent conductive oxide layer.

12. The organic light-emitting display apparatus as claimed in claim 11, wherein the first electrode includes a stacked layer structure formed by sequentially stacking indium tin oxide (ITO), silver (Ag), and ITO, and a thickness of a Ag layer in the first electrode is 600 Å or greater.

13. The organic light-emitting display apparatus as claimed in claim 1, wherein a thickness of the second layer is between about 0.5 nm to about 5 nm.

14. The organic light-emitting display apparatus as claimed in claim 1, wherein a thickness of the third layer is between about 0.5 nm to about 5 nm.

* * * * *